United States Patent
Hahn et al.

(10) Patent No.: US 8,273,588 B2
(45) Date of Patent: Sep. 25, 2012

(54) METHOD FOR PRODUCING A LUMINOUS DEVICE AND LUMINOUS DEVICE

(75) Inventors: Berthold Hahn, Hemau (DE); Markus Maute, Regensburg (DE); Siegfried Herrmann, Neukirchen (DE)

(73) Assignee: OSRAM Opto Semiconductros GmbH, Regensburg (DE)

( * ) Notice: Subject to any disclaimer, the term of this patent is extended or adjusted under 35 U.S.C. 154(b) by 143 days.

(21) Appl. No.: 12/838,075

(22) Filed: Jul. 16, 2010

(65) Prior Publication Data
US 2011/0012142 A1 Jan. 20, 2011

Related U.S. Application Data

(60) Provisional application No. 61/226,982, filed on Jul. 20, 2009.

(51) Int. Cl.
*H01L 21/00* (2006.01)
(52) U.S. Cl. ........ 438/28; 438/27; 438/29; 438/35; 257/89; 257/99; 257/E33.057; 257/E33.061; 257/E33.062
(58) Field of Classification Search ........ 257/88, 257/89, 93, 98, 99, 594, E33.057, E33.061, 257/E33.056, 91, E33.062; 438/22, 23, 26, 438/107, 108, 110, 113, 115, 458, 462, 464, 438/27–29, 33–35
See application file for complete search history.

(56) References Cited

U.S. PATENT DOCUMENTS
5,940,683 A 8/1999 Holm et al.
6,358,764 B1 * 3/2002 Nemoto ........... 438/22
6,547,249 B2 * 4/2003 Collins et al. ........... 257/88
6,623,171 B2 * 9/2003 Heremans et al. ........... 385/53
(Continued)

FOREIGN PATENT DOCUMENTS
DE 10 2007 010 244 A1 8/2008
(Continued)

OTHER PUBLICATIONS

Takahashi, K., et al., "High Density LED Display Panel on Silicon Microreflector and Integrated Circuit," Proceedings of 1995 Japan International, 18th IEEE/CPMT International Electronic Manufacturing Technology Syposium, Dec. 4-6, 1995, pp. 272-275, Omiya, Japan.

(Continued)

*Primary Examiner* — Matthew Landau
*Assistant Examiner* — Joseph C Nicely
(74) *Attorney, Agent, or Firm* — Slater & Matsil, L.L.P.

(57) ABSTRACT

A method for producing a luminous device is specified. A number of light emitting diodes each have a radiation-transmissive carrier and at least two semiconductor bodies spatially separated from one another. Each semiconductor body is provided for generating electromagnetic radiation. The semiconductor bodies can be driven separately from one another and the semiconductor bodies are arranged at the top side of the radiation-transmissive carrier on the radiation-transmissive carrier. A chip assemblage is composed of CMOS chips each of which has at least two connection locations at its top side. At least one of the light emitting diodes is connected to one of the CMOS chips. The light emitting diode is arranged, at the top side of the radiation-transmissive carrier, at the top side of the CMOS chip and each semiconductor body of the light emitting diode is connected to a connection location of the CMOS chip.

18 Claims, 3 Drawing Sheets

U.S. PATENT DOCUMENTS

| | | | |
|---|---|---|---|
| 6,784,463 B2 * | 8/2004 | Camras et al. | 257/99 |
| 6,924,233 B1 * | 8/2005 | Chua et al. | 438/678 |
| 7,766,490 B2 * | 8/2010 | Harbers et al. | 353/94 |
| 7,843,074 B2 * | 11/2010 | Gao et al. | 257/779 |
| 2002/0159705 A1 * | 10/2002 | Naniwae | 385/49 |
| 2003/0020399 A1 * | 1/2003 | Moller et al. | 313/504 |
| 2005/0057641 A1 | 3/2005 | Ogihara et al. | |
| 2005/0212406 A1 | 9/2005 | Daniels et al. | |
| 2006/0030125 A1 * | 2/2006 | Sackrison et al. | 438/460 |
| 2006/0131757 A1 | 6/2006 | Yu et al. | |
| 2006/0158458 A1 * | 7/2006 | Kojima et al. | 345/592 |
| 2007/0045761 A1 * | 3/2007 | Basin et al. | 257/440 |
| 2008/0276508 A1 * | 11/2008 | Lee | 40/544 |
| 2008/0283849 A1 * | 11/2008 | Imai | 257/89 |
| 2009/0032799 A1 * | 2/2009 | Pan | 257/13 |
| 2009/0075843 A1 * | 3/2009 | Jiang et al. | 506/39 |
| 2009/0108269 A1 * | 4/2009 | Negley et al. | 257/88 |
| 2009/0179213 A1 * | 7/2009 | Cannon et al. | 257/98 |
| 2009/0206758 A1 * | 8/2009 | Kobilke | 315/113 |
| 2009/0225542 A1 * | 9/2009 | Belliveau et al. | 362/231 |
| 2009/0309514 A1 * | 12/2009 | Kim | 315/291 |
| 2010/0006873 A1 * | 1/2010 | Raring et al. | 257/90 |
| 2010/0025699 A1 * | 2/2010 | Liu et al. | 257/89 |
| 2010/0084964 A1 | 4/2010 | Groetsch et al. | |
| 2010/0096993 A1 * | 4/2010 | Ashdown et al. | 315/113 |
| 2010/0109030 A1 * | 5/2010 | Krames et al. | 257/93 |
| 2010/0123694 A1 * | 5/2010 | Cok et al. | 345/206 |
| 2010/0144073 A1 * | 6/2010 | Louwsma et al. | 438/28 |
| 2010/0164344 A1 * | 7/2010 | Boerner et al. | 313/1 |
| 2010/0171145 A1 * | 7/2010 | Morgan et al. | 257/99 |
| 2010/0201253 A1 * | 8/2010 | Cok et al. | 313/498 |
| 2010/0290221 A1 * | 11/2010 | Tarsa et al. | 362/231 |
| 2010/0320479 A1 * | 12/2010 | Minato et al. | 257/88 |
| 2010/0320488 A1 * | 12/2010 | Horie | 257/91 |
| 2011/0001693 A1 * | 1/2011 | Kim et al. | 345/102 |
| 2011/0025190 A1 * | 2/2011 | Jagt | 313/499 |
| 2011/0121758 A1 * | 5/2011 | Bierhuizen et al. | 315/294 |
| 2011/0241033 A1 * | 10/2011 | Nagai | 257/88 |
| 2011/0248292 A1 * | 10/2011 | Park | 257/89 |
| 2011/0248295 A1 * | 10/2011 | Stauss et al. | 257/89 |

FOREIGN PATENT DOCUMENTS

| | | |
|---|---|---|
| EP | 0 977 063 A1 | 2/2000 |
| EP | 1 115 155 A2 | 7/2001 |
| EP | 1 988 577 A1 | 11/2008 |
| WO | WO 2008/062783 A1 | 5/2008 |
| WO | WO 2008062783 A1 * | 5/2008 |

OTHER PUBLICATIONS

ZIPTRONIX, "Pioneering 3D Integrated Circuit Process Technology; 3D IC Integration (3D IC Assembly)," downloaded from: http://www.ziptronix.com/techno/3d.html, date unknown, 1 page.

"Pioneering 3D Integrated Circuit Process Technology 3D IC Integration (3D IC Assembly)," Technologies, http://www.ziptronix.com/techno/3d.html, 2002, Ziptronix, Inc.

* cited by examiner

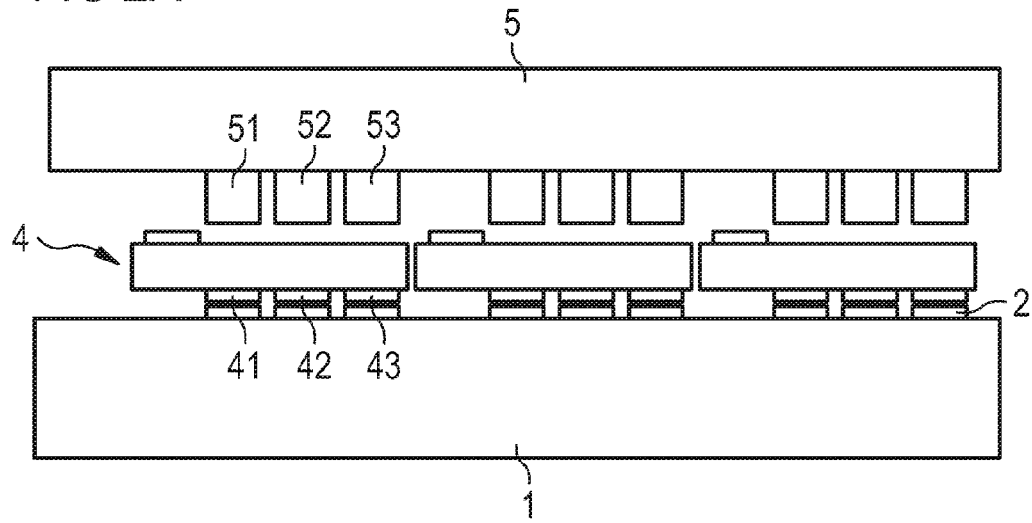
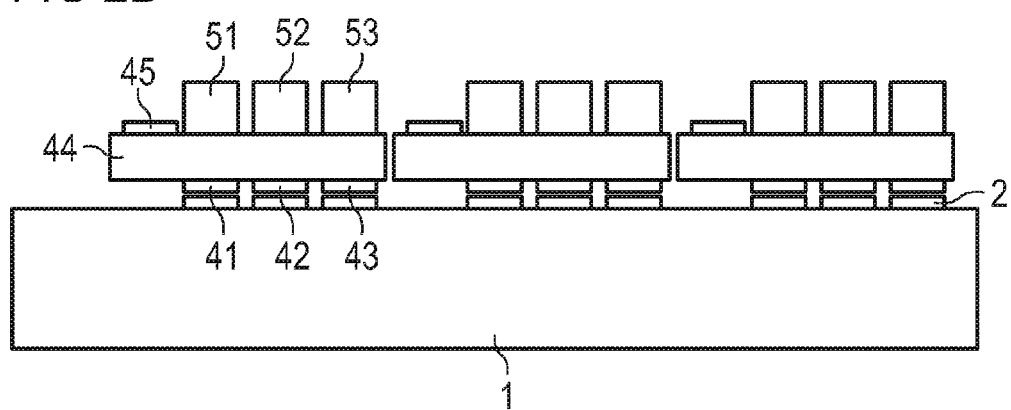
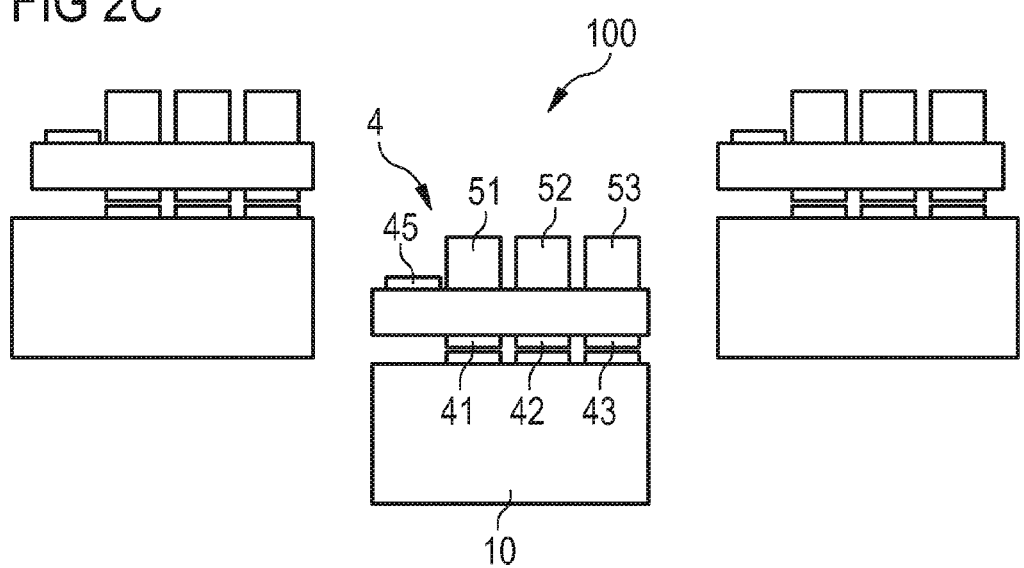

METHOD FOR PRODUCING A LUMINOUS DEVICE AND LUMINOUS DEVICE

This application claims the benefit of U.S. Provisional Application No. 61/226,982, filed on Jul. 20, 2009, which application is hereby incorporated herein by reference.

TECHNICAL FIELD

A method for producing a luminous device is specified. A luminous device, e.g., which can be produced by the method, is furthermore specified.

SUMMARY

The luminous device described here can be used in a miniaturized full-color display, for example. Furthermore, it is possible for the luminous device described here to be used as a light source in an optical projection device, for example, in a miniaturized beamer.

In accordance with at least one embodiment, firstly a number of light emitting diodes are provided. Each of the light emitting diodes comprises a radiation-transmissive carrier and at least two semiconductor bodies spatially separated from one another. The semiconductor bodies are arranged, for example, at a top side of the radiation-transmissive carrier on the radiation-transmissive carrier. The top side of the carrier also forms the top side of the light emitting diode.

Each of the semiconductor bodies is provided for generating electromagnetic radiation and the semiconductor bodies can be driven separately from one another for this purpose. That is to say that the semiconductor bodies of the light emitting diode can emit electromagnetic radiation at different times or simultaneously.

The radiation-transmissive carrier is transmissive, preferably transparent, to the electromagnetic radiation emitted by the semiconductor bodies during the operation of the light emitting diode. The radiation-transmissive carrier is formed by a radiation-transmissive foil, for example.

The semiconductor bodies of the light emitting diodes are preferably free of a growth substrate. That is to say that the semiconductor bodies of the light emitting diodes are in each grown epitaxially, and the growth substrate on which the semiconductor bodies were deposited epitaxially is separated from the semiconductor bodies.

In accordance with at least one embodiment of the method, a further method step involves providing a chip assemblage composed of semiconductor chips that are provided for driving the light emitting diodes. In this case, each of the semiconductor chips comprises, at its top side, at least two connection locations provided for the connection of a light emitting diode. The semiconductor chips of the chip assemblage are so-called CMOS chips (complementary metal oxide semiconductor chips), for example. CMOS chips are semiconductor components in which both p-channel and n-channel MOSFETs are used on a common substrate.

In accordance with at least one embodiment of the method, at least one of the light emitting diodes is connected to one of the CMOS chips, wherein the light emitting diode is arranged, at its top side, at the top side of the CMOS chip and each semiconductor body of the light emitting diode is connected to a connection location of the CMOS chip. That is to say that the light emitting diode and the CMOS chip face one another with their top sides and the semiconductor bodies of the light emitting diode are connected to corresponding connection locations of the CMOS chip. In this case, the CMOS chip preferably has a number of connection locations corresponding at least to the number of semiconductor bodies of the light emitting diode. By way of example, exactly one light emitting diode is placed onto each CMOS chip of the chip assemblage, the semiconductor bodies of the light emitting diode in each case being connected to assigned connection locations of the assigned CMOS chip. The light emitting diodes can in each case be driven via the connection locations of the CMOS chip, such that generation of electromagnetic radiation by the semiconductor bodies is controlled by the chip assigned to the light emitting diode.

In accordance with at least one embodiment of the method, firstly a multiplicity of light emitting diodes are provided, wherein each light emitting diode has a radiation-transmissive carrier and at least two semiconductor bodies spatially separated from one another, each semiconductor body is provided for generating electromagnetic radiation, the semiconductor bodies can be driven separately from one another and the semiconductor bodies are arranged at the top side of the radiation-transmissive carrier on the radiation-transmissive carrier. A further method step involves providing a chip assemblage consisting of at least one CMOS chip, wherein each CMOS chip has at least two connection locations at its top side. Subsequently, at least one of the light emitting diodes is connected to one of the CMOS chips, wherein the light emitting diode is arranged, at its top side, at the top side of the CMOS chip and each semiconductor body of the light emitting diode is connected to a connection location of the CMOS chip.

A luminous device is furthermore specified. In accordance with at least one embodiment, the luminous device comprises a chip for driving a light emitting diode, for example, a CMOS chip, wherein the chip has at least two connection locations at its top side.

In accordance with at least one embodiment, the luminous device comprises at least one light emitting diode, wherein each light emitting diode of the luminous device has a radiation-transmissive carrier and at least two semiconductor bodies spatially separated from one another, each semiconductor body is provided for generating electromagnetic radiation, the semiconductor bodies can be driven separately from one another and the semiconductor bodies are arranged at the top side of the radiation-transmissive carrier on the radiation-transmissive carrier.

The fact that the semiconductor bodies are spatially separated from one another can mean, for example, that the semiconductor bodies are not connected to one another by a common element such as, for example, a common growth substrate. The only mechanical connection between the semiconductor bodies is then provided, for example, by the radiation-transmissive carrier on which the semiconductor bodies are arranged.

In accordance with at least one embodiment of the luminous device, the at least one light emitting diode and the CMOS chip face one another with their top sides and each semiconductor body of the at least one light emitting diode is connected to a connection location of the CMOS chip. In this case, preferably, each semiconductor body of the at least one light emitting diode is connected to exactly one connection location of the CMOS chip and other semiconductor bodies of the light emitting diode are then not connected to this connection location of the CMOS chip. That is to say that semiconductor bodies and connection locations are assigned to one another one-to-one.

In accordance with at least one embodiment of the luminous device, the luminous device comprises a drive chip, for example, a CMOS chip, wherein the CMOS chip has at least two connection locations at its top side. The luminous device furthermore comprises at least one light emitting diode, wherein the light emitting diode has a radiation-transmissive carrier and at least two semiconductor bodies spatially separated from one another, each semiconductor body is provided for generating electromagnetic radiation, the semiconductor bodies can be driven separately from one another and the semiconductor bodies are arranged at the top side of the radiation-transmissive carrier on the radiation-transmissive carrier. In this case, the at least one light emitting diode and the CMOS chip face one another with their top sides and each semiconductor body of the at least one light emitting diode is connected to a connection location of the CMOS chip.

Preferably, the luminous device described here is producible by a method described here. That means that, in this embodiment, all of the features described for the method are also disclosed for the luminous device, and vice versa.

The following embodiments can relate both to the method and the device itself.

In accordance with at least one embodiment, the connection location is brought into direct contact with a surface of the semiconductor body which is remote from the radiation-transmissive carrier. That is to say that the light emitting diode is placed onto the assigned chip in such a way that a semiconductor body and that connection location of the chip which is assigned to the semiconductor body touch one another. In this case, by way of example, the connection location is electrically conductively connected to the p-conducting side of the semiconductor body, such that the connection location serves for making contact with the p-side of the semiconductor body.

In accordance with at least one embodiment, at the underside of the radiation-transmissive carrier, the underside being remote from the semiconductor bodies, for at least one of the semiconductor bodies, a conversion element is applied to the radiation-transmissive carrier in such a way that electromagnetic radiation emitted by the semiconductor during the operation thereof passes through the conversion element and is at least partly wavelength-converted by the latter.

In this case, the semiconductor body is preferably provided for generating electromagnetic radiation from the spectral range of ultraviolet radiation and/or blue light during operation. By way of example, in this case, all of the semiconductor bodies of the light emitting diode can be embodied such that they are of identical type, and so all of the semiconductor bodies of the light emitting diode emit electromagnetic radiation from the same spectral range. The conversion elements disposed downstream of the semiconductor bodies can then be different from each other. In this way it is possible, for example, to produce a luminous device which can generate green, red and blue light during operation. In this case, the green light and the red light are generated, for example, by complete wavelength conversion of the electromagnetic radiation generated by the semiconductor bodies.

As an alternative, it is also possible for the semiconductor bodies of each light emitting diode, per se, already to be provided for generating red, green and blue light. The semiconductor bodies of the light emitting diode then differ from one another.

In accordance with at least one embodiment, the conversion elements are present in an assemblage, that is to say that a multiplicity of conversion elements are connected to one another by a common carrier, for example. The common carrier can be, for example, a growth substrate onto which the conversion elements are applied, for example, deposited epitaxially. The conversion elements can then be formed from II/VI semiconductor materials for example. The multiplicity of conversion elements present in an assemblage are then preferably simultaneously connected to the multiplicity of light emitting diodes. This can be effected, for example, after the application of the light emitting diodes diodes onto the chip assemblage. The connecting element of the multiplicity of conversion elements, that is to say the growth substrate, for example, can be removed after connection to the light emitting diodes.

As an alternative, however, it is also possible for the conversion elements to be applied individually onto the light emitting diodes. The conversion elements can then also be formed, for example, with ceramic phosphors such as, for example, cerium-doped YAG.

In accordance with at least one embodiment, the assemblage composed of chip assemblage and a multiplicity of light emitting diodes is singulated to form individual luminous devices, of which each luminous device comprises at least one light emitting diode, wherein only the chip assemblage is severed during singulation.

In the present case, the light emitting diodes are individually connected to assigned connection locations of the chips of the chip assemblage. That is to say that, during connection to the chip assemblage, the light emitting diodes themselves are not present in an assemblage, rather the light emitting diodes are discrete components which can be applied individually on the chip assemblage. In order to singulate the chip assemblage, therefore, it is not necessary to singulate through the light emitting diodes; only the chip assemblage itself has to be severed. In this way, it is not possible for the light emitting diodes to be damaged by severing of the light emitting diodes, since this is obviated. Furthermore, the separate mounting of the light emitting diodes on the chip assemblage minimizes the interaction of the individual processing steps. Furthermore, in the case of separate mounting of the light emitting diodes it is possible to position the latter with a very high accuracy of below 1 µm on the assigned chip of the chip assemblage. By virtue of the connection of the light emitting diodes to drive chips, a drive circuit and/or complex wiring for the light emitting diodes themselves are/is obviated, which permits the use of particularly cost-effective light emitting diodes having a small cross-sectional area. Furthermore, the individual light emitting diodes can be tested prior to connection to the drive chips, which leads to a reduction of rejects of the luminous device.

In accordance with at least one embodiment, the at least one light emitting diode has, at its side of the radiation-transmissive carrier which is remote from the semiconductor bodies, a connection location provided for jointly making electrical contact with all the semiconductor bodies of the light emitting diode. The common connection location is, for example, a connection location via which contact can be made with the semiconductor bodies of the light emitting diode on the n-sides. The n-sides of the semiconductor bodies are then at a common potential. The semiconductor bodies are driven separately by energization via the assigned connection location of the assigned CMOS chip. Via this connection location, contact is then made with the semiconductor bodies on the p-sides. In this case, the polarity can also be interchanged; that is to say that the connection location on the radiation-transmissive carrier can then be provided for making contact with the semiconductor bodies on the p-sides.

In accordance with at least one embodiment, the radiation-transmissive carrier of the at least one light emitting diode comprises a plastic foil into which and/or onto which are arranged electrical lines for making contact with the semiconductor bodies. That is to say that the radiation-transmissive carrier itself is formed from an electrically insulating material. By way of example, plated-through holes are introduced into the electrically insulating material of the radiation-transmissive carrier and connect the semiconductor bodies at the top side of the carrier to the connection location at the underside of the carrier. However, the electrical lines for connecting the semiconductor bodies to the connection location can also run on the outer areas of the plastic foil.

BRIEF DESCRIPTION OF THE DRAWINGS

The method and the luminous device described here are explained in greater detail below on the basis of exemplary embodiments and the associated figures.

Elements which are identical, of identical type or act identically are provided with the same reference symbols in the figures. The figures and the size relationships of the elements illustrated in the figures among one another should not be regarded as true to scale. Moreover, individual elements may be illustrated with an exaggerated size in order to allow better illustration and/or in order to afford a better understanding.

DETAILED DESCRIPTION OF ILLUSTRATIVE EMBODIMENTS

Figure 1A:
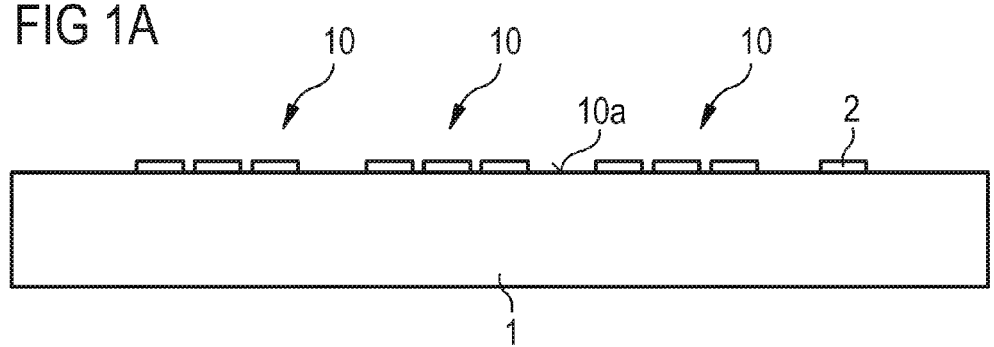
FIGS. 1A-1F (collectively FIG. 1) and FIGS. 2A-2C (collectively FIG. 2) provide schematic sectional illustrations used to describe exemplary embodiments of the method and of the luminous device of embodiments of the present invention.

FIG. 1A shows, in a schematic sectional illustration, a chip assemblage 1 having a multiplicity of CMOS chips 10. Three connection locations 2 are arranged at the top side 10a of each CMOS chip 10. Each of the connection locations 2 is provided for energizing the semiconductor body of a light emitting diode.

Figure 1B:
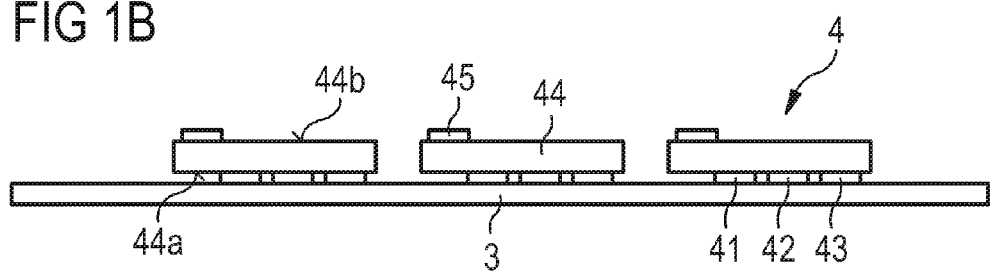
Figure 1C:
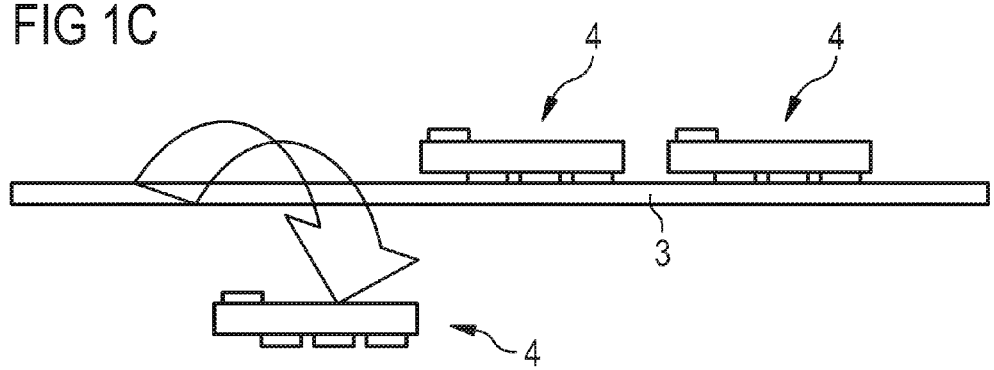

The schematic sectional illustration in FIG. 1B illustrates three light emitting diodes 4 arranged on a common carrier 3, for example a foil. As shown in FIG. 1C, the light emitting diodes 4 can be separated individually from the carrier 3.

Each light emitting diode 4 comprises a radiation-transmissive carrier 44, at the top side 44a of which in each case three semiconductors bodies 41, 42, 43 are arranged. The semiconductor bodies 41, 42, 43 are spatially separated from one another and are only connected to one another via the radiation-transmissive carrier 44.

The radiation-transmissive carrier 44 is a transparent plastic foil.

Each light emitting diode 4 furthermore comprises at the underside 44b of the carrier 44, the underside being remote from the top side 44a, a connection location 45, via which contact can be made with the semiconductor bodies 41, 42, 43 on the n-sides, for example.

In the present case, the semiconductor bodies 41, 42, 43 are mutually different semiconductor bodies which are provided for generating electromagnetic radiation having a different color in each case during operation. By way of example, the semiconductor body 41 generates red light during operation, the semiconductor body 42 generates green light during operation, and the semiconductor body 43 generates blue light during operation.

Figure 1D:
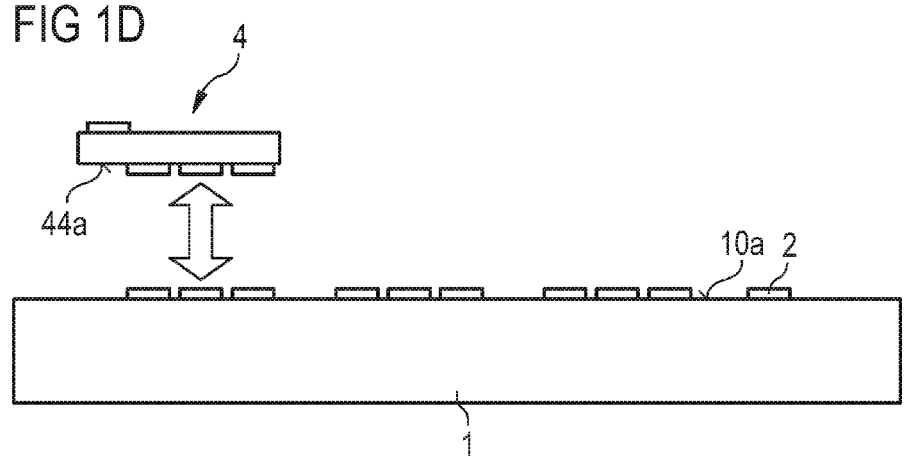
Figure 1E:
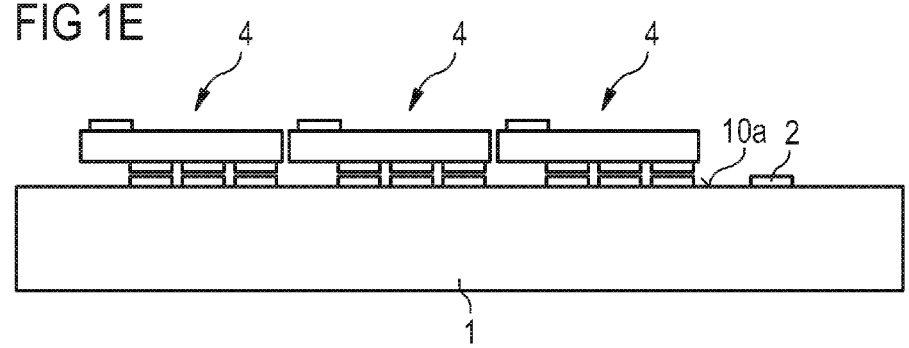

FIG. 1C schematically illustrates that the light emitting diodes 4 can be separated from the carrier 3 in a simple manner. The light emitting diodes 4 are then separate components which can be arranged separately from one another on the CMOS chips 10 of the chip assemblage 1. In this case, the light emitting diodes 4 are arranged on the CMOS chips 10 in such a way that the top sides 44a and 10a of carrier 44 and chip 10 lie opposite one another. Each semiconductor body 41, 42, 43 of each light emitting diode 4 is in this case mechanically fixed and electrically contact-connected to an associated connection location 2 of the CMOS chip 10, see FIGS. 1D and 1E.

In a last method step, the assemblage composed of light emitting diodes 4 and CMOS chips 10 can be singulated. The smallest possible unit then comprises exactly one CMOS chip 10 and one assigned light emitting diode 4. The side faces 10c of the CMOS chips 10 are thus produced by singulation and have traces of a singulation process, for example, sawing grooves.

It is also possible, however, for the luminous device 100 in each case to comprise a multiplicity of CMOS chips 10 and a multiplicity of light emitting diodes 4. In this case, the luminous device 100 is particularly well suited as a full-color display wherein each light emitting diode 4 represents a pixel comprising three sub-pixels that are respectively formed by the semiconductor bodies 41, 42, 43.

Figure 1F:
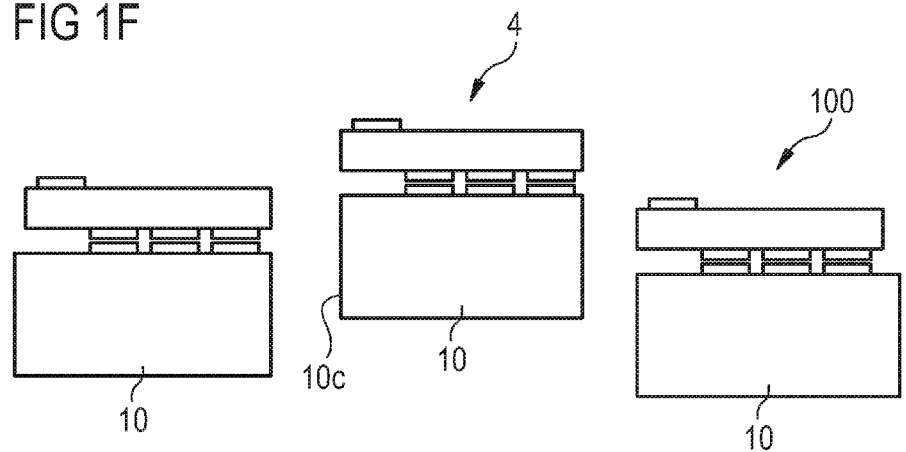

Luminous device 100 comprising exactly one light emitting diode 4 and exactly one CMOS chip 10, such as are illustrated in FIG. 1F, for example, can be used, for example, as light sources in optical projection apparatuses.

The semiconductor bodies 41, 42, 43 can be driven via the CMOS chip 10 in a predeterminable manner.

An alternative exemplary embodiment of a method described here is explained in greater detail in conjunction with FIGS. 2A to 2C. In this exemplary embodiment, the semiconductor bodies 41, 42, 43 are embodied such that they are of identical type. That is to say that the semiconductor bodies 41, 42, 43 of each light emitting diode 4 generate electromagnetic radiation from the same spectral range during operation.

By way of example, the semiconductor bodies 41, 42, 43 generate UV radiation during operation. The schematic sectional illustration in FIG. 2A shows that the light emitting diodes 4 have already been applied on the chip assemblage 1 and each semiconductor body 41, 42, 43 has been connected to the assigned connection location 2 of the assigned CMOS chip 10. As shown in FIG. 2B, conversion elements 51, 52, 53 are then in each case applied to the light emitting diodes 4. The conversion elements are fixed to the underside 44b of each carrier in such a way that they are disposed downstream of the assigned semiconductor body 41, 42, 43 in the emission direction thereof.

By way of example, the conversion elements 51, 52, 53 are applied on a common carrier 5 before being applied to the light emitting diodes. The conversion elements can be formed, for example, with a semiconductor material, for example, a II/VI semiconductor material. They can be deposited epitaxially on the carrier 5. However, it is also possible for ceramic conversion elements to be involved, which are applied to the light emitting diodes 4 in an assemblage, that is to say on a common carrier 5, or individually.

After detachment from the carrier 5, a luminous device is provided wherein a conversion element 51, 52, 53 is disposed downstream of each semiconductor body 41, 42, 43 of each light emitting diode 4. Electromagnetic radiation generated by the semiconductor bodies during operation passes through the radiation-transmissive carrier 44, for example, and is wavelength-converted there as completely as possible to form visible light. As a result, each light emitting diode is suitable, for example, for emitting red, green and blue light.

As illustrated in FIG. 2C, the chip assemblage 1 can, as necessary, be severed into luminous devices 100, wherein the separation process again exclusively involves separation through the chip assemblage 1 and not the light emitting diodes 4.

The invention is not restricted to the exemplary embodiments by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

What is claimed is:

1. A method for producing a luminous device, the method comprising:
   providing a plurality of light emitting diodes, wherein each light emitting diode has a radiation-transmissive carrier and at least two semiconductor bodies spatially separated from one another, each semiconductor body being provided for generating electromagnetic radiation, wherein the semiconductor bodies can be driven separately from one another and the semiconductor bodies are arranged at a top side of the radiation-transmissive carrier on the radiation-transmissive carrier;
   providing a chip assemblage comprising CMOS chips, wherein each CMOS chip has at least two connection locations at a top side;
   connecting one of the light emitting diodes to one of the CMOS chips, wherein the is semiconductor bodies are arranged at the top side of the radiation-transmissive carrier and at the top side of the CMOS chip such that the light emitting diode and the CMOS chip face one another at their top sides and each semiconductor body of the light emitting diode is connected to a connection location of the CMOS chip; and
   applying a conversion element to an underside of the radiation-transmissive carrier, the underside being remote from the semiconductor bodies, wherein, for at least one of the semiconductor bodies, the conversion element is applied to the radiation-transmissive carrier in such a way that electromagnetic radiation emitted by the semiconductor body during operation thereof passes through the conversion element and is at least partly wavelength-converted by the conversion element.

2. The method as claimed in claim 1, wherein the connection location is brought into direct contact with a surface of the semiconductor body which is remote from the radiation-transmissive carrier.

3. The method as claimed in claim 1, wherein applying the conversion element comprises simultaneously applying a plurality of conversion elements to a corresponding plurality of light emitting diodes.

4. The method as claimed in claim 1, further comprising singulating the chip assemblage to form individual luminous devices, each luminous device comprising at least one light emitting diode.

5. The method as claimed in claim 4, wherein singulating the chip assemblage comprises severing only the chip assemblage.

6. The method as claimed in claim 1, wherein all the semiconductor bodies of the at least one light emitting diode generate electromagnetic radiation in a same spectral range and the conversion element is disposed downstream of at least one of the semiconductor bodies, wherein the conversion element is arranged at an underside of the radiation-transmissive carrier in such a way that electromagnetic radiation emitted by the at least one semiconductor body during operation thereof passes through the conversion element and is at least partly wavelength-converted by the conversion element, the underside being remote from the semiconductor body.

7. The method as claimed in claim 1, wherein the radiation-transmissive carrier of at least one light emitting diode comprises a plastic foil into which and/or onto which are arranged electrical lines for making contact with the semiconductor bodies.

8. A luminous device comprising:
   a CMOS chip that includes at least two connection locations at a top side;
   a light emitting diode, wherein the light emitting diode comprises a radiation-transmissive carrier and at least two semiconductor bodies spatially separated from one another, each semiconductor body being provided for generating electromagnetic radiation, wherein the semiconductor bodies can be driven separately from one another and the semiconductor bodies are arranged at a top side of the radiation-transmissive carrier;
   wherein the light emitting diode and the CMOS chip face one another at their top sides and each semiconductor body of the light emitting diode is connected to a connection location of the CMOS chip; and
   wherein the light emitting diode has a connection location at a side of the radiation-transmissive carrier that is remote from the semiconductor bodies, the connection location provided for jointly making electrical contact with all the semiconductor bodies of the light emitting diode.

9. The luminous device as claimed in claim 8, wherein all the semiconductor bodies of the light emitting diode generate electromagnetic radiation in the same spectral range.

10. The luminous device as claimed in claim 9, further comprising a conversion element disposed downstream of at least one of the semiconductor bodies.

11. The luminous device as claimed in claim 10, wherein the conversion element is arranged at an underside of the radiation-transmissive carrier, the underside being remote from the semiconductor body, the conversion element being arranged in such a way that electromagnetic radiation emitted by the semiconductor body during operation thereof passes through the conversion element and is at least partly wavelength-converted.

12. The luminous device as claimed in claim 8, wherein the at least two semiconductor bodies of the light emitting diode generate electromagnetic radiation from mutually different spectral ranges during operation.

13. The luminous device as claimed in claim 8, wherein the radiation-transmissive carrier of the light emitting diode comprises a plastic foil into which and/or onto which are arranged electrical lines for making contact with the semiconductor bodies.

14. A method for producing a luminous device, the method comprising:
   providing a plurality of light emitting diodes, wherein each light emitting diode has a radiation-transmissive carrier and at least two semiconductor bodies spatially separated from one another, each semiconductor body being provided for generating electromagnetic radiation, wherein the semiconductor bodies can be driven separately from one another and the semiconductor bodies are arranged at a top side of the radiation-transmissive carrier on the radiation-transmissive carrier;
   providing a chip assemblage comprising CMOS chips, wherein each CMOS chip has at least two connection locations at a top side;
   connecting one of the light emitting diodes to one of the CMOS chips, wherein the-semiconductor bodies are arranged at the top side of the radiation-transmissive carrier and at the top side of the CMOS chip such that the light emitting diode and the CMOS chip face one another at their top sides and each semiconductor body of the light emitting diode is connected to a connection location of the CMOS chip;

wherein all the semiconductor bodies of the at least one light emitting diode generate electromagnetic radiation in a same spectral range and a conversion element is disposed downstream of at least one of the semiconductor bodies, wherein the conversion element is arranged at an underside of the radiation-transmissive carrier in such a way that electromagnetic radiation emitted by the at least one semiconductor body during operation thereof passes through the conversion element and is at least partly wavelength-converted by the conversion element, the underside being remote from the semiconductor body.

15. The method as claimed in claim 14, wherein the connection location is brought into direct contact with a surface of the semiconductor body which is remote from the radiation-transmissive carrier.

16. The method as claimed in claim 14, further comprising singulating the chip assemblage to form individual luminous devices, each luminous device comprising at least one light emitting diode.

17. The method as claimed in claim 14, wherein the radiation-transmissive carrier of at least one light emitting diode comprises a plastic foil into which and/or onto which are arranged electrical lines for making contact with the semiconductor bodies.

18. A luminous device comprising:
a CMOS chip that includes at least two connection locations at a top side;
a light emitting diode, wherein the light emitting diode comprises a radiation-transmissive carrier and at least two semiconductor bodies spatially separated from one another, each semiconductor body being provided for generating electromagnetic radiation, wherein the semiconductor bodies can be driven separately from one another and the semiconductor bodies are arranged at a top side of the radiation-transmissive carrier; and
a conversion element disposed downstream of at least one of the semiconductor bodies;
wherein the light emitting diode and the CMOS chip face one another at their top sides and each semiconductor body of the light emitting diode is connected to a connection location of the CMOS chip;
wherein all the semiconductor bodies of the light emitting diode generate electromagnetic radiation in the same spectral range; and
wherein the conversion element is arranged at an underside of the radiation-transmissive carrier, the underside being remote from the semiconductor body, the conversion element being arranged in such a way that electromagnetic radiation emitted by the semiconductor body during operation thereof passes through the conversion element and is at least partly wavelength-converted.

* * * * *

UNITED STATES PATENT AND TRADEMARK OFFICE
CERTIFICATE OF CORRECTION

PATENT NO.         : 8,273,588 B2
APPLICATION NO.    : 12/838075
DATED              : September 25, 2012
INVENTOR(S)        : Hahn et al.

It is certified that error appears in the above-identified patent and that said Letters Patent is hereby corrected as shown below:

In Col. 7, line 26, claim 1, delete "is".

Signed and Sealed this
First Day of January, 2013

David J. Kappos
*Director of the United States Patent and Trademark Office*